United States Patent
Dimaano, Jr. et al.

(10) Patent No.: US 9,023,690 B2
(45) Date of Patent: May 5, 2015

(54) LEADFRAME AREA ARRAY PACKAGING TECHNOLOGY

(71) Applicants: Antonio Bambalan Dimaano, Jr., Singapore (SG); Nathapong Suthiwongsunthorn, Singapore (SG); Yong Bo Yang, Singapore (SG)

(72) Inventors: Antonio Bambalan Dimaano, Jr., Singapore (SG); Nathapong Suthiwongsunthorn, Singapore (SG); Yong Bo Yang, Singapore (SG)

(73) Assignee: United Test and Assembly Center, Singapore (SG)

( * ) Notice: Subject to any disclaimer, the term of this patent is extended or adjusted under 35 U.S.C. 154(b) by 0 days.

(21) Appl. No.: 13/681,302

(22) Filed: Nov. 19, 2012

(65) Prior Publication Data

US 2014/0138808 A1    May 22, 2014

(51) Int. Cl.

| | |
|---|---|
| *H01L 21/56* | (2006.01) |
| *H01L 23/31* | (2006.01) |
| *H01L 21/78* | (2006.01) |
| *H01L 21/50* | (2006.01) |
| *H01L 23/495* | (2006.01) |
| *H01L 21/48* | (2006.01) |

(52) U.S. Cl.
CPC .............. *H01L 21/78* (2013.01); *H01L 21/50* (2013.01); *H01L 23/495* (2013.01); *H01L 23/3107* (2013.01); *H01L 23/49541* (2013.01); *H01L 21/4821* (2013.01); *H01L 21/568* (2013.01); *H01L 2224/48091* (2013.01); *H01L 2224/73204* (2013.01); *H01L 2224/73265* (2013.01); *H01L 2924/15311* (2013.01)

(58) Field of Classification Search
CPC .............. H01L 21/562; H01L 21/6835; H01L 23/3104; H01L 23/481; H01L 23/498; H01L 23/49811; H01L 23/5389; H01L 24/03; H01L 24/97; H01L 25/50
See application file for complete search history.

(56) References Cited

U.S. PATENT DOCUMENTS

| | | | |
|---|---|---|---|
| 6,242,815 B1 | 6/2001 | Hsu et al. | |
| 6,380,002 B2 | 4/2002 | Hsu et al. | |
| 6,784,547 B2 * | 8/2004 | Pepe et al. | 257/758 |
| 7,364,941 B2 * | 4/2008 | Usui et al. | 438/106 |
| 7,453,140 B1 | 11/2008 | Lin et al. | |
| 7,473,586 B1 * | 1/2009 | Lo et al. | 438/127 |
| 7,638,879 B2 | 12/2009 | Jiang et al. | |
| 7,750,467 B2 | 7/2010 | Pu et al. | |
| 7,993,967 B2 | 8/2011 | Jiang et al. | |
| 8,058,100 B2 | 11/2011 | Pu et al. | |
| 8,187,922 B2 | 5/2012 | Aboush et al. | |
| 2001/0010947 A1 | 8/2001 | Hsu et al. | |
| 2010/0276792 A1 * | 11/2010 | Chi et al. | 257/660 |
| 2011/0147931 A1 | 6/2011 | Nondhasitthichai et al. | |

* cited by examiner

*Primary Examiner* — Brett Feeney
*Assistant Examiner* — Pamela E Perkins
(74) *Attorney, Agent, or Firm* — Haverstock & Owens, LLP

(57) ABSTRACT

Embodiments of the present invention are directed to leadframe area array packaging technology for fabricating an area array of I/O contacts. A manufactured package includes a polymer material substrate, an interconnect layer positioned on top of the polymer material substrate, a die coupled to the interconnect layer via wire bonds or conductive pillars, and a molding compound encapsulating the die, the interconnect layer and the wire bonds or conductive pillars. The polymer material is typically formed on a carrier before assembly and is not removed to act as the substrate of the manufactured package. The polymer material substrate has a plurality of through holes that exposes the interconnect layer at predetermined locations and enables solder ball mounting or solder printing directly to the interconnect layer. In some embodiments, the semiconductor package includes a relief channel in the polymer material substrate to improve the reliability performance of the manufactured package.

23 Claims, 6 Drawing Sheets

Package Assembly

Step 120'

Step 145'

Laser drilling solder mask

LEADFRAME AREA ARRAY PACKAGING TECHNOLOGY

FIELD OF THE INVENTION

The present invention is related to the field of semiconductor device manufacturing. More specifically, the present invention relates to leadframe area array packaging technology.

BACKGROUND

Many leadless semiconductor packages are mass produced by using sheets of leadframe arrays. Leadframes typically provide a design and preliminary framework for a semiconductor package. However, certain aspects of leadframe technology must be well monitored including etch back process and limitations on I/O count. Etched leadframes can pose problems during manufacture, particularly during the handling and wire bonding processes. These problems relate to the strength and structural integrity of the leadframes and, thus, have adverse effects on useful yield and quality of the manufactured product. In addition, the semiconductor industry is presently moving into cost benefits and is looking into emerging packages that can compete equally in terms of I/O. Thus, there is a need to manufacture semiconductor packages that provides wider process control, without negatively affecting the quality and adding cost and other manufacturing problems.

SUMMARY OF THE DISCLOSURE

Embodiments of the present invention are directed to leadframe area array packaging technology for fabricating an area array of I/O contacts. A manufactured package includes a polymer material substrate, an interconnect layer positioned on top of the polymer material substrate, a die coupled to the interconnect layer via wire bonds or conductive pillars, and a molding compound encapsulating the die, the interconnect layer and the wire bonds or conductive pillars. The polymer material is typically formed on a carrier before assembly and is not removed to act as the substrate of the manufactured package. The polymer material substrate has a plurality of through holes that exposes the interconnect layer at predetermined locations and enables solder ball mounting or solder printing directly to the interconnect layer. In some embodiments, the semiconductor package includes a relief channel in the polymer material substrate to improve the reliability performance of the manufactured package.

In one aspect, a semiconductor package is provided. The semiconductor package includes a layer of polymer material coupled with a first side of a carrier strip, wherein the carrier strip is configured to be removed after encapsulation, a plurality of interconnects fabricated on a top surface of the layer of polymer material, a semiconductor die coupled with at least a portion of the plurality of interconnects, and a molding compound encapsulating the semiconductor die and the plurality of interconnects.

In some embodiments, the semiconductor die is coupled with the interconnects via wire bonds, and the molding compound encapsulates the wire bonds. In some embodiments, the semiconductor package is coupled with the interconnects via conductive pillars, and the molding compound encapsulates the conductive pillars.

In some embodiments, the layer of polymer material includes a plurality of openings. The plurality of openings can be filled with solder. In some embodiments, the layer of polymer material further includes a pressure/stress relief channel. The relief channel can be below a die attach area or below an underfill area.

In some embodiments, the semiconductor package is a LGA-style package, a QFN-style package, or a flip chip package.

In another aspect, a semiconductor package is provided. The semiconductor package includes a polymer material substrate coupled with a first side of a carrier strip, wherein the carrier strip is configured to be removed after encapsulation, an interconnect layer positioned on top of the polymer material substrate, a die coupled to the interconnect layer via wire bonds, a molding compound encapsulating the die, and a plurality of through holes in the polymer material substrate, wherein the plurality of through holes exposes the interconnect layer at predetermined locations. In some embodiments, the semiconductor package includes a relief channel in the polymer material substrate, below a die attach area.

In yet another aspect, a semiconductor package is provided. The semiconductor package includes a polymer material substrate coupled with a first side of a carrier strip, wherein the carrier strip is configured to be removed after encapsulation, an interconnect layer positioned on top of the polymer material substrate, a die coupled to the interconnect layer via conductive pillars, a molding compound encapsulating the die, and a plurality of through holes in the polymer material substrate, wherein the plurality of through holes exposes the interconnect layer at predetermined locations. In some embodiments, the semiconductor package includes a relief channel in the polymer material substrate below an underfill area.

In yet another aspect, a method of fabricating a semiconductor package is provided. The method includes providing carrier strip. The carrier strip is of copper base, of glass, or of other equivalent material.

The method also includes applying a layer of polymer material on a surface of the carrier strip. The polymer material can be liquid or non-liquid (e.g., dry). In some embodiments, the polymer material is solder resist. In some embodiments, the layer of polymer material is applied on the surface of the carrier strip using an UV adhesive.

The method also includes fabricating interconnects on a top surface of the layer of polymer material. In some embodiments, fabricating interconnects include laminating a metal foil, applying a layer of dry film resist, and creating patterns on the layer of dry film resist to form the interconnects. In some embodiments, the metal foil is Cu foil and has a thickness of 5-50 µm.

Alternatively, fabricating interconnects include forming trenches in the layer of polymer material, and filling the trenches with a material to form the interconnects. In some embodiments, the material is Cu, Ag, NiPdAu, or other suitable material.

Alternatively, fabricating interconnects include laminating a photomask on top of the layer of polymer material, exposing patterns, and plating up the interconnects. In some embodiments, the interconnects are plated with Cu, Ag, NiPdAu, or other suitable material.

The method also includes assembling a package. In some embodiments, assembling a package includes coupling a die to at least a portion of the interconnects, wirebonding the die to the interconnects, and encapsulating the die, the interconnects and wirebonds. The die can be coupled to the at least a portion of the interconnects using one of non-conductive epoxy, a solder mask at a die flag area, and a die attach pad.

Alternatively, assembling a package includes coupling a die to at least a portion of the interconnects via conductive pillars, and encapsulating the die, the conductive pillars and the interconnects.

The method also includes decoupling the carrier strip from the package. In some embodiments, decoupling the carrier strip includes dry/wet etching the carrier strip from the layer of polymer material.

Alternatively, decoupling the carrier strip includes debonding the carrier strip from the layer of polymer material.

The method also includes creating a plurality of openings in the layer of polymer material. In some embodiments, the plurality of openings exposes the interconnects at predetermined locations.

The method also includes applying suitable material in the plurality of openings. In some embodiments, applying suitable material includes using one of solder printing and solder ball mounting in the plurality of openings.

Alternatively, applying suitable material includes performing forming conductive pillars, electroless plating, incorporating immersion tin, or applying solderability preservatives.

The method also includes singulating the package from other packages.

In some embodiments, the method also includes creating a pressure/stress relief channel in the layer of polymer material. In some embodiments, the method also includes forming at least one openings in the layer of polymer material.

In yet another aspect, a method of fabricating a semiconductor package is provided. The method includes obtaining a carrier strip, applying a layer of solder resist on a surface of the carrier strip, and fabricating an area array of I/O contacts on a top surface of the layer of solder resist. In some embodiments, fabricating includes laminating a conductive foil on a top surface of the layer of solder resist, and interconnect patterning using dry film resist and etching process. The method further includes assembling a package and removing the carrier strip from the layer of solder resist.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein or with equivalent alternatives.

Reference will now be made in detail to implementations of the present invention as illustrated in the accompanying drawings. The same reference indicators will be used throughout the drawings and the following detailed description to refer to the same or like parts.

Overview

Embodiments of the present invention are directed to leadframe area array packaging technology for fabricating an area array of I/O contacts. A manufactured package includes a polymer material substrate, an interconnect layer positioned on top of the polymer material substrate, a die coupled to the interconnect layer via wire bonds or conductive pillars, and a molding compound encapsulating the die, the interconnect layer and the wire bonds or conductive pillars. The polymer material is typically formed on a carrier before assembly and is not removed so that it acts as the substrate of the manufactured package. The polymer material substrate has a plurality of through holes that exposes the interconnect layer at predetermined locations and enables solder ball mounting or solder printing directly to the interconnect layer. In some embodiments, the semiconductor package includes a relief channel in the polymer material substrate to improve the reliability performance of the manufactured package.

An object of the present invention is to increase I/O of leadless packages by improving L/S (lines per space) capability. Another object is to provide a better etch-back technology solution that does not require a high level of accuracy, which addresses current issues faced by other leadless packages through an etch-back process. Yet another object is to include additional self-aligning surface mount features, such as by having solder balls as interconnects. Yet another object is to be able to convert 2 L to 1 L through finer L/S capability owing to etching of thin Cu foil, laser trench or photomask plating technology.

Specifics

Figure 1:
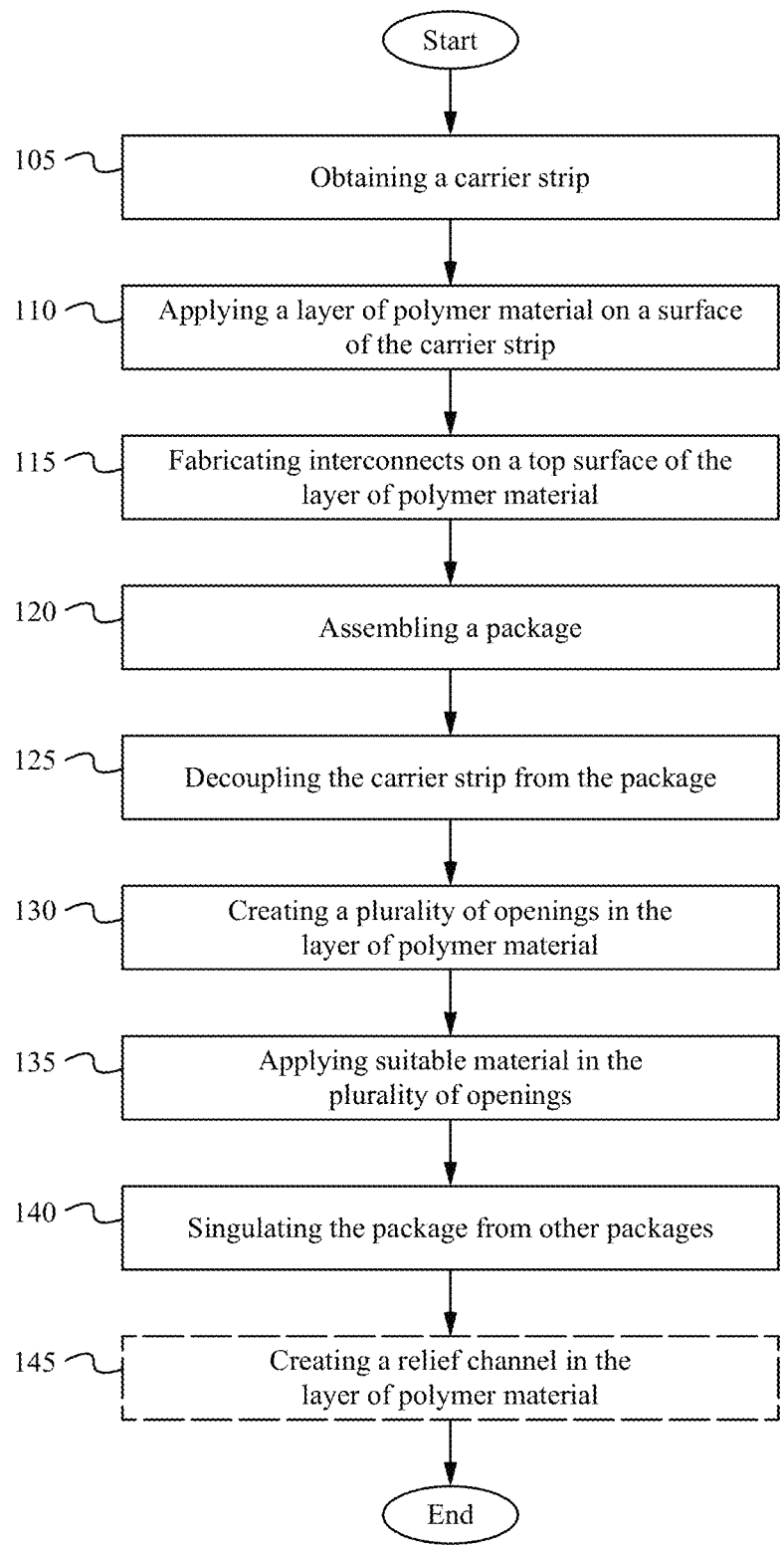
FIG. 1 illustrates an exemplary method of fabricating a semiconductor package in accordance with the present invention.
Figure 2A:
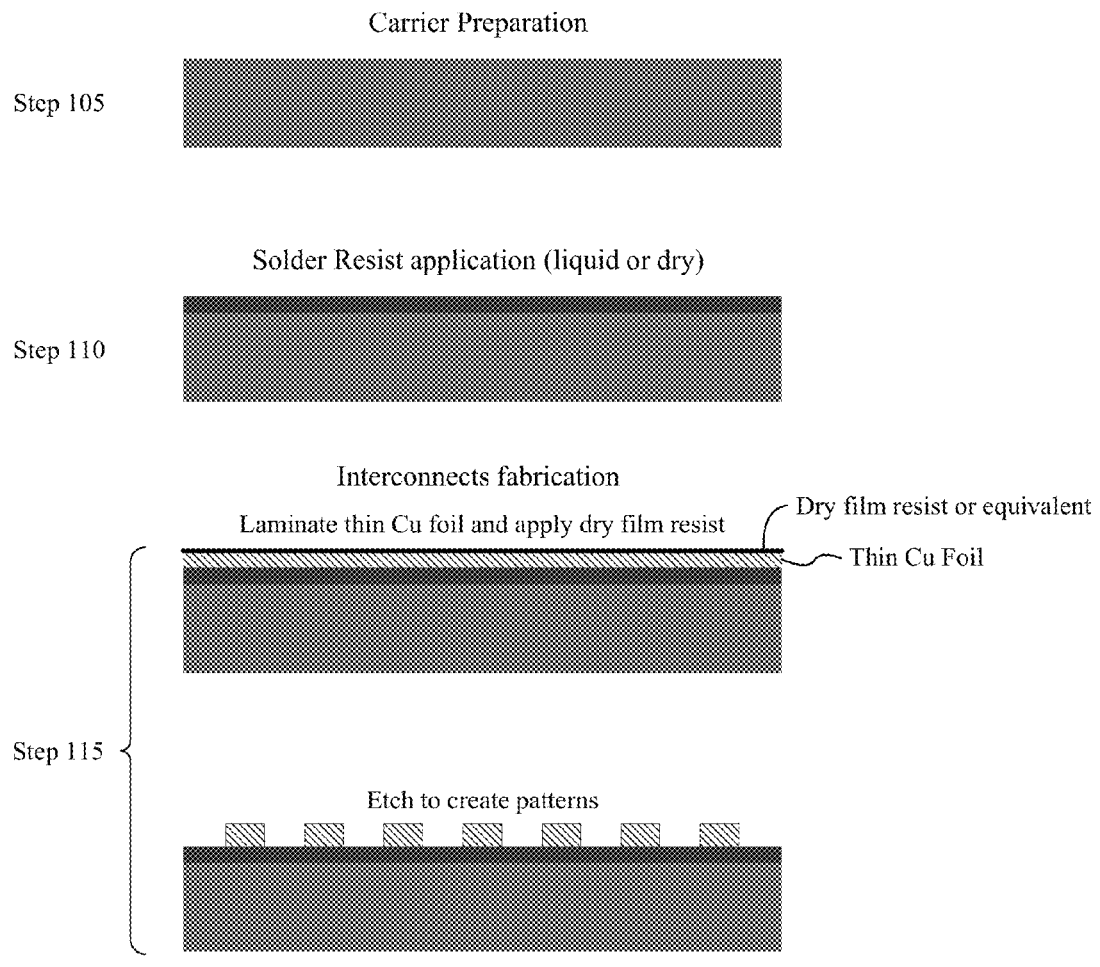
FIGS. 2A-2C illustrate an exemplary result produced by each step of the method of FIG. 1.
Figure 2B:
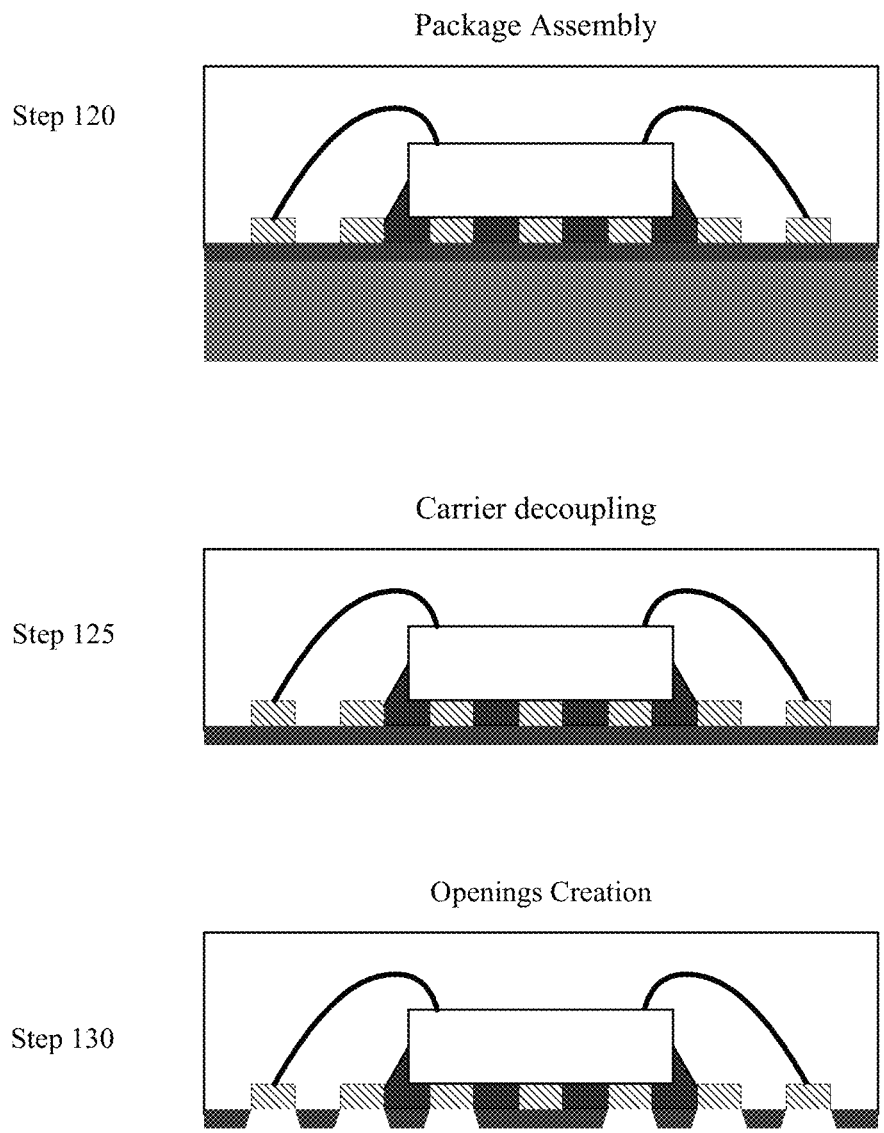
Figure 2C:
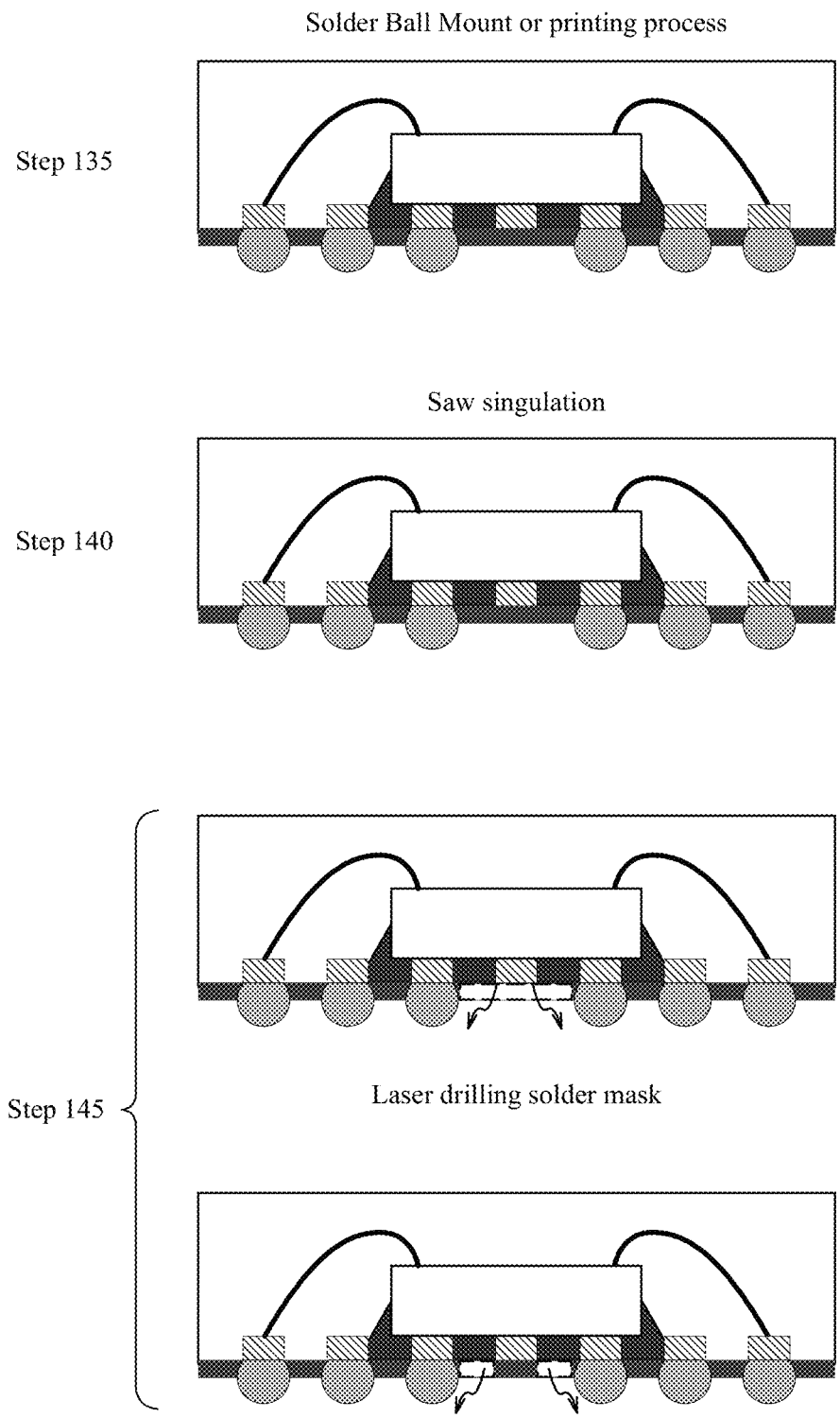

FIG. 1 illustrates an exemplary method 100 of fabricating a semiconductor package in accordance with the present invention. An exemplary result produced by each step of the method 100 is illustrated in FIGS. 2A-2C. The method 100 begins at a step 105, where a carrier strip is provided. In some embodiments, the carrier strip is copper based. Alternatively, the carrier strip is of glass or equivalent material. However, the carrier strip can be of any suitable material. In some embodiments, the carrier strip has a thickness of 5 or 8 mils.

At a step 110, a layer of polymer material is applied on a surface of the carrier strip. The polymer material can be liquid or non-liquid (e.g., dry). In some embodiments, the polymer material is solder resist. In some embodiments, the polymer material is applied on the surface of the carrier strip using an UV adhesive or any suitable adhesive. The layer of polymer material typically acts as the substrate of the package.

At a step 115, interconnects are fabricated on a top surface of the layer of polymer material. In some embodiments, the interconnects layer includes an area array of I/O contacts and conductive trace line, enabling fan-in/fan-out configurations. In FIG. 2A, the interconnects are fabricated using a metallic foil. In some embodiments, the metallic foil is Cu foil. Depending on the L/S requirement, the thickness of the Cu foil can range from 5-50 µm. As shown in FIG. 2A, the Cu foil is laminated on a top surface of the layer of polymer material, and a layer of dry film resist is applied on top of the Cu foil. Patterns are created on the layer of dry film resist to form the interconnects.

Figure 3:
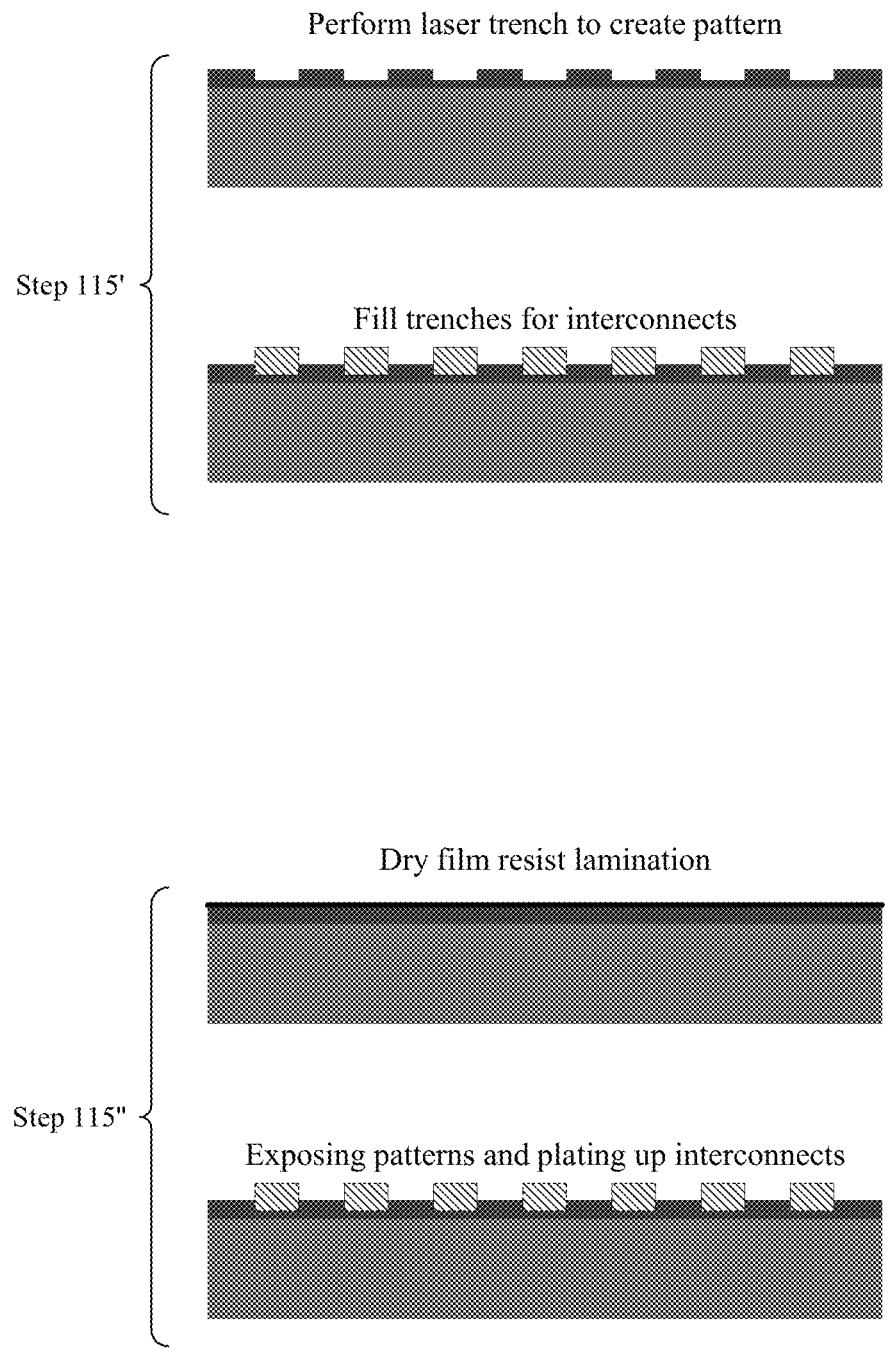
FIG. 3 illustrates two alternative interconnection fabrication methods in accordance with the present invention.

Other interconnection fabrication methods are contemplated. FIG. 3 illustrates two alternative interconnection fabrication methods 115', 115" in accordance with the present invention. In the first alternate interconnection fabrication method 115', trenches are formed in the layer of polymer material. In some embodiments, the trenches are formed using a suitable laser trench technology. The trenches are then filled with conductive material to form the interconnects. The material can be Cu, Ag, NiPdAu or other suitable material.

In the second alternate interconnection fabrication method 115″, a photomask is laminated on top of the layer of polymer material, patterns are exposed and the interconnections are plated up. In some embodiments, the interconnections are plated with Cu, Ag, NiPdAu or other suitable material.

Referring back to FIGS. 1 and 2A-2C, at a step 120, a package is assembled. The step 120 and subsequent steps occur simultaneously on all units within the carrier strip. These units can be arranged in an array format within the carrier strip. Both wire bond types and flip chips are applicable.

For example, in FIG. 2B, the package assembly includes coupling a die to at least a portion of the interconnects, wire-bonding the die to the interconnects, and encapsulating the die, the interconnects, and the wirebonds. The die can be coupled to the at least a portion of the interconnects using non-conductive epoxy or a solder mask at a die flag area, then with conductive epoxy or a die attach film.

Figure 4A:
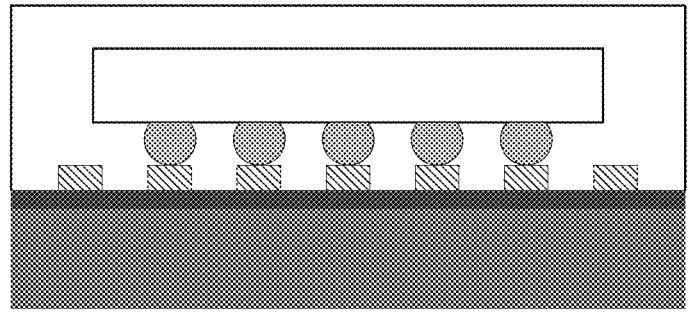
FIGS. 4A-4B illustrate an exemplary semiconductor package in accordance with the present invention.

For another example, in FIG. 4A, the assembly of the package step 120′ includes coupling a die to at least a portion of the interconnects via conductive pillars, and encapsulating the die, the interconnects, and the conductive pillars. Alternatively, the die can be coupled to the at least a portion of the interconnects via any conventional C4 process, taking into consideration bonding pad dimension control.

In some embodiments, the assembly of the package also includes a post mold curing step, laser marking step, and/or strip testing step.

Use of a non-flexible substrate (e.g., solder mask) in the present invention offers several advantages during assembly, which includes, but are not limited to, preserving the integrity of the wire bonds, preserving the integrity of the flip chip interconnection especially prior to underfill, minimizing handling problems associated with the flexing of the substrate as it moves from one process to another, and supporting SiP modules, which require additional weight from multiple chips and passive components.

After the package is assembled, at a step 125, the carrier strip is decoupled from the package. In some embodiments, decoupling includes dry/wet etching the carrier strip from the layer of polymer material. A full etch back of the carrier strip is performed. Alternatively, decoupling includes debonding the carrier strip from the layer of polymer material.

At a step 130, a plurality of openings is created in the layer of polymer material. The plurality of openings can be formed via laser drilling. The plurality of openings exposes the interconnects at predetermined locations. In some embodiments, the step 130 is performed at the same time as laser marking.

At a step 135, suitable material is applied in the plurality of openings. In some embodiments, applying the suitable material includes using solder printing or solder ball mounting in the plurality of openings directly to the interconnect layer. Alternatively, applying the suitable material includes performing forming conductive pillars, electroless plating, incorporating immersion tin, or applying solderability preservatives.

At a step 140, the package is singulated from other packages to form an individual finished device. Singulation can be done using high-speed saw, laser, high-pressure water jet or some other suitable means.

Figure 4B:
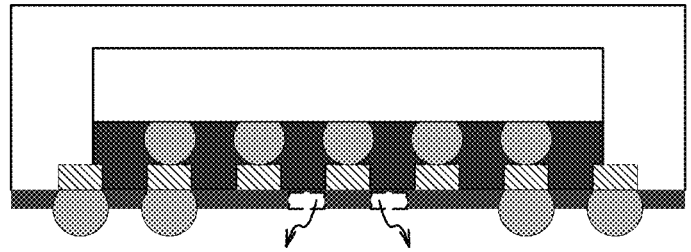

At an optional step 145, pressure/stress relief channel is formed in the layer of polymer material. In some embodiments, laser drilling is used to form opening(s) in the layer of polymer material. The opening(s) act as the pressure/stress relief channel(s) for removal of moisture and/or improving the reliability performance of the package. In some embodiments, the pressure/stress relief channel is formed in the step 130. For example, in FIG. 2C, the laser drilling is done below a die attach area. For another example, in FIG. 4B, the laser drilling 145′ is done below an underfill area. It should be understood that although FIG. 4B shows underfill material, underfill material is optional and/or is not needed per specific flip chip package requirements. After the optional step 145, the method 100 ends.

A semiconductor package of the present invention includes a layer of polymer material, a plurality of interconnects fabricated on a top surface of the layer of polymer material, a semiconductor die coupled with at least a portion of the plurality of interconnects, and a molding compound encapsulating the semiconductor die and the plurality of interconnects. In some embodiments, the semiconductor die is coupled with the interconnects via wire bonds, and the molding compound encapsulates the wire bonds. In some embodiments, the semiconductor package is coupled with the interconnects via conductive pillars, and the molding compound encapsulates the conductive pillars. In some embodiments, the layer of polymer material includes a plurality of openings. The plurality of openings can be filled with solder. In some embodiments, the layer of polymer material further includes a pressure/stress relief channel. The relief channel can below a die attach area or an underfill area. The semiconductor package can be a LGA-style package, a QFN-style package, or a flip chip package.

An exemplary semiconductor package is illustrated in FIG. 2C. In FIG. 2C, the semiconductor package includes a polymer material substrate, an interconnect layer positioned on top of the polymer material substrate, a die coupled to the interconnect layer via wire bonds, a molding compound encapsulating the die, and a plurality of through holes in the polymer material substrate, wherein the plurality of through holes exposes the interconnect layer at predetermined locations. In some embodiments, the interconnect layer is an area array of I/O contacts fabricated on a top surface of the layer of polymer material. In some embodiments, the semiconductor package includes a relief channel in the polymer material substrate, below a die attach area.

Another exemplary semiconductor package is illustrated in FIG. 4B. In FIG. 4B, the semiconductor package includes a polymer material substrate, an interconnect layer positioned on top of the polymer material substrate, a die coupled to the interconnect layer via conductive pillars, a molding compound encapsulating the die, and a plurality of through holes in the polymer material substrate, wherein the plurality of through holes exposes the interconnect layer at predetermined locations. In some embodiments, the interconnect layer is an area array of I/O contacts fabricated on a top surface of the layer of polymer material. In some embodiments, the semiconductor package includes a relief channel in the polymer material substrate, below an underfill area.

Advantages

The present invention is a new leadless structure manufacturing method whereby an area array of I/O contacts is fabricated. As discussed above, in some embodiments, the area array of I/O is fabricated via thin conductive foil patterning on a top side on a substrate and solder mask back-etching on a terminal side of the substrate. These embodiments and the method of producing the same allow a finer L/S capability and provide maximum I/O as compared to current laminate based packages. The thin conductive foil enables finer L/S than previously possible. Back-etching is more forgiving as compared to some current available packages, such as HLA, because back-etching does not require high level of accuracy. Benefits include, but are not limited to, the following:

Overall cost reduction is improved during 2 L to 1 L conversion and by utilizing a carrier of Cu base or any equivalent material. A Cu carrier provides good stiffness on the package being processed.

Good process control during an etch-back process which does not require high level of accuracy and hence addresses the current issue being faced right now by other leadless packages through etch back process.

Self-alignment features during surface mount technology by having solder balls as method of interconnect.

Form factor is maintained during 2 L to 1 L conversion.

Form factor is improved, as compared with current leadless technology (e.g., QFN, DR-QFN, MR-QFN), because current leadless technology on single or dual rows may need to increase package size to cater for higher I/O. In the present invention, the package size is maintained owing to finer L/S.

Overall good manufacturing demonstration as key process almost comparable with existing FBGA process.

One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A method of fabricating a semiconductor package comprising:
    providing a carrier strip having top and bottom surfaces;
    applying a layer of polymer material on the top surface of the carrier strip;
    fabricating interconnects on a top surface of the layer of polymer material;
    assembling a package;
    decoupling the carrier strip from the package;
    forming a plurality of openings in the layer of polymer material;
    applying suitable material in the plurality of openings; and
    singulating the package from other packages, wherein the layer of polymer material is applied using an UV adhesive.

2. The method of claim 1, wherein the carrier strip is of copper base.

3. The method of claim 1, wherein the carrier strip is of glass.

4. The method of claim 1, wherein the polymer material is liquid.

5. The method of claim 1, wherein the polymer material is non-liquid.

6. The method of claim 1, wherein the polymer material is solder resist.

7. The method of claim 1, wherein fabricating interconnects include:
    laminating a metal foil; and
    applying a layer of dry film resist; and
    forming patterns on the layer of dry film resist to form the interconnects.

8. The method of claim 7, wherein the metal foil is Cu foil and has a thickness of 5-50μm.

9. The method of claim 1, wherein fabricating interconnects include:
    forming trenches in the layer of polymer material; and
    filling the trenches with a material to form the interconnects.

10. The method of claim 9, wherein the material is one of Cu, Ag, and NiPdAu.

11. The method of claim 1, wherein fabricating interconnects include:
    laminating a photomask on top of the layer of polymer material;
    exposing patterns; and
    plating up the interconnects.

12. The method of claim 1, wherein the interconnects are plated with one of Cu, Ag, and NiPdAu.

13. The method of claim 1, wherein assembling a package includes:
    coupling a die to at least a portion of the interconnects;
    wirebonding the die to the interconnects; and
    encapsulating the die, the interconnects and wirebonds.

14. The method of claim 13, wherein the die is coupled to the at least a portion of the interconnects using one of non-conductive epoxy, a solder mask at a die flag area, and a die attach pad.

15. The method of claim 1, wherein assembling a package includes:
    coupling a die to at least a portion of the interconnects via conductive pillars; and
    encapsulating the die, the conductive pillars and the interconnects.

16. The method of claim 1, wherein decoupling the carrier strip includes dry/wet etching the carrier strip from the layer of polymer material.

17. The method of claim 1, wherein decoupling the carrier strip includes debonding the carrier strip from the layer of polymer material.

18. The method of claim 1, wherein creating a plurality of openings includes exposing the interconnects at predetermined locations.

19. The method of claim 1, wherein applying suitable material includes using one of solder printing and solder ball mounting in the plurality of openings.

20. The method of claim 1, wherein applying suitable material includes performing one of the forming conductive pillars, electroless plating, incorporating immersion tin, and applying solderability preservatives.

21. The method of claim 1, further comprising forming at least one openings in the layer of polymer material.

22. A method of fabricating a semiconductor package comprising:
    providing a carrier strip having top and bottom surfaces;
    applying a layer of polymer material on the top surface of the carrier strip;
    fabricating interconnects on a top surface of the layer of polymer material;
    assembling a package;
    decoupling the carrier strip from the package;
    forming a plurality of openings in the layer of polymer material;
    applying suitable material in the plurality of openings;
    singulating the package from other packages; and
    forming a pressure/stress relief channel in the layer of polymer material.

23. A method of fabricating a semiconductor package comprising:
    providing a strip having a base layer, a layer of polymer material on a top surface of the base layer and interconnects on a top surface of the layer of the polymer material;

assembling a package by coupling a die with one or more of the interconnects;
removing the base layer from the package;
forming a plurality of openings in the layer of polymer material after the package is assembled and the base layer has been removed;
applying a filling material in the plurality of the openings; and
singulating the package from other packages; and
forming a pressure/stress relief channel in the layer of polymer material.

\* \* \* \* \*